(12) United States Patent
Tsao et al.

(10) Patent No.: US 12,154,848 B2
(45) Date of Patent: Nov. 26, 2024

(54) ELECTRONIC PACKAGE AND MANUFACTURING METHOD THEREOF, AND SUBSTRATE STRUCTURE

(71) Applicant: SILICONWARE PRECISION INDUSTRIES CO., LTD., Taichung (TW)

(72) Inventors: Chia-Wen Tsao, Taichung (TW); Wen-Chen Hsieh, Taichung (TW); Yi-Lin Tsai, Taichung (TW); Hsiu-Fang Chien, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 202 days.

(21) Appl. No.: 18/145,824

(22) Filed: Dec. 22, 2022

(65) Prior Publication Data
US 2024/0145372 A1    May 2, 2024

(30) Foreign Application Priority Data
Oct. 26, 2022   (TW) .................................. 111140684

(51) Int. Cl.
| | |
|---|---|
| H05K 1/11 | (2006.01) |
| H01L 21/56 | (2006.01) |
| H01L 23/31 | (2006.01) |
| H01L 23/498 | (2006.01) |
| H05K 1/18 | (2006.01) |
| H01L 23/00 | (2006.01) |

(52) U.S. Cl.
CPC ...... *H01L 23/49838* (2013.01); *H01L 21/563* (2013.01); *H01L 23/3185* (2013.01); *H01L 23/49816* (2013.01); *H01L 23/49822* (2013.01); *H05K 1/113* (2013.01); *H05K 1/181* (2013.01); *H01L 24/16* (2013.01); *H01L 24/32* (2013.01); *H01L 24/73* (2013.01); *H01L 2224/16055* (2013.01); *H01L 2224/16227* (2013.01); *H01L 2224/16237* (2013.01); *H01L 2224/32225* (2013.01); *H01L 2224/73204* (2013.01); *H01L 2924/35121* (2013.01); *H05K 2201/09472* (2013.01)

(58) Field of Classification Search
CPC ....................................... H05K 1/113
See application file for complete search history.

(56) References Cited

U.S. PATENT DOCUMENTS

| | | | |
|---|---|---|---|
| 7,005,750 B2 * | 2/2006 | Liu ......................... | H05K 1/111 257/E23.068 |
| 2005/0258544 A1 * | 11/2005 | Kim ...................... | H05K 3/3452 257/773 |

* cited by examiner

*Primary Examiner* — Sherman Ng
(74) *Attorney, Agent, or Firm* — Hsuanyeh Law Group PC (57) ABSTRACT

A substrate structure is provided, in which an insulating protection layer is formed on a substrate body having a plurality of electrical contact pads, and the insulating protection layer has a plurality of openings corresponding to the plurality of exposed electrical contact pads, and the insulating protection layer is formed with a hollow portion surrounding a partial edge of at least one of the electrical contact pads at at least one of the openings, so as to reduce the barrier of the insulating protection layer.

8 Claims, 9 Drawing Sheets

ELECTRONIC PACKAGE AND MANUFACTURING METHOD THEREOF, AND SUBSTRATE STRUCTURE

BACKGROUND

1. Technical Field

The present disclosure relates to a substrate structure for a semiconductor manufacturing process, and more particularly, to a substrate structure with a solder-resist layer, an electronic package and a manufacturing method thereof.

2. Description of Related Art

With the development of the electronic industry, today's electronic products have tended to be designed in the direction of light, thin, short, and diversified functions, and semiconductor packaging technology has also developed different packaging types. In order to meet the requirements of high integration and miniaturization of semiconductor devices, a flip-chip package structure is often used in the industry.

Figure 1A:
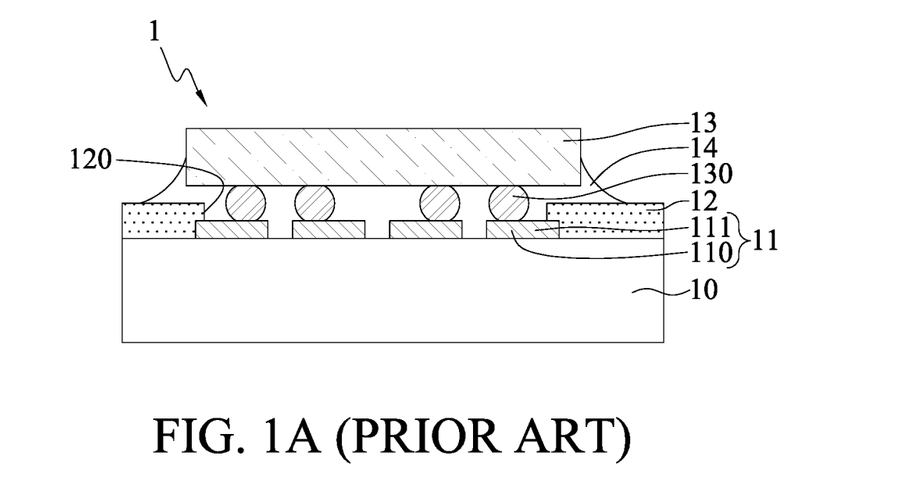
FIG. 1A is a schematic cross-sectional view of a conventional semiconductor package.
Figure 1B:
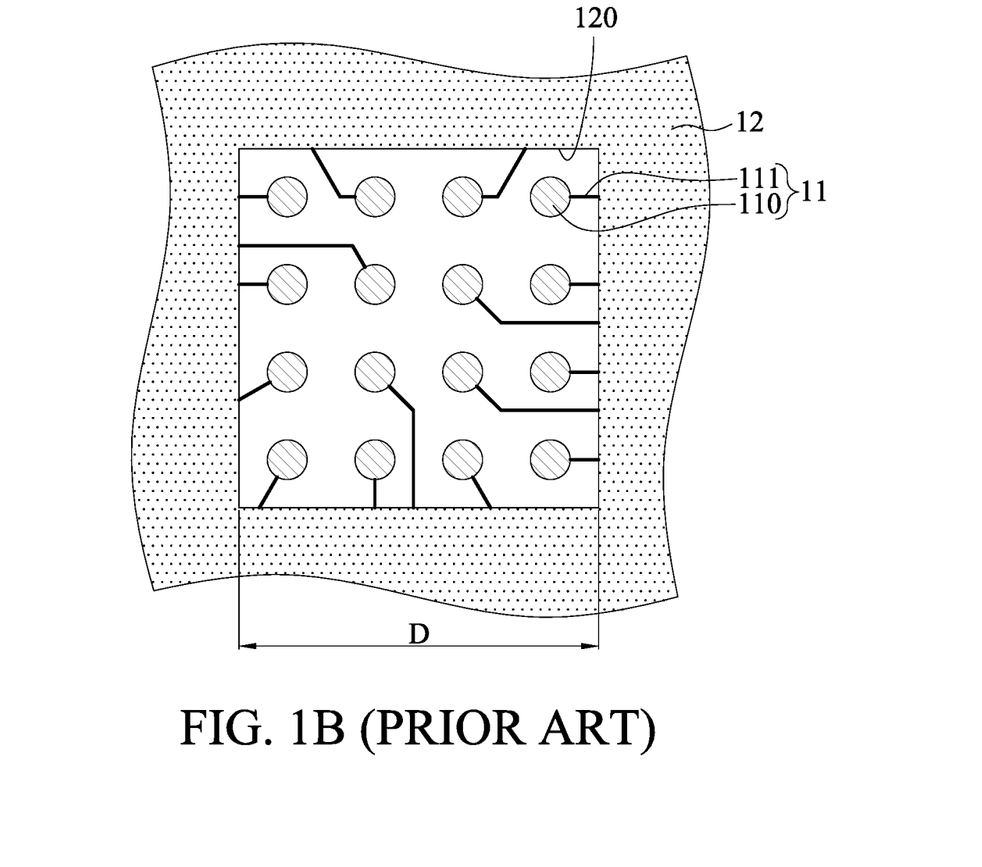
FIG. 1B is a schematic partial top plan view of a package substrate of the conventional semiconductor package.

FIG. 1A is a schematic cross-sectional view of a conventional semiconductor package 1. As shown in FIG. 1A, a semiconductor chip 13 is bonded onto electrical contact pads 110 of a circuit layer 11 of a package substrate 10 via a plurality of solder bumps 130 and is electrically connected to conductive traces 111 of the circuit layer 11, and then an underfill 14 is formed between the semiconductor chip 13 and the package substrate 10 to cover the solder bumps 130, wherein an insulating protection layer 12 is formed on the package substrate 10, and a single window 120 is formed corresponding to a die-placement region, as shown in FIG. 1B, to expose each of the electrical contact pads 110 and part of the conductive traces 111.

However, since the bonding force between the underfill 14 and the dielectric material (that is, the surface material of the package substrate 10) or the insulating protection layer 12 is good, but the bonding force between the underfill 14 and the copper circuit layer 11 is poor, so the underfill 14 is in contact with more circuit layers 11 in the die-placement region, which leads to the problem of delamination, that is, the separation of the underfill 14 and the package substrate 10.

Figure 1C:
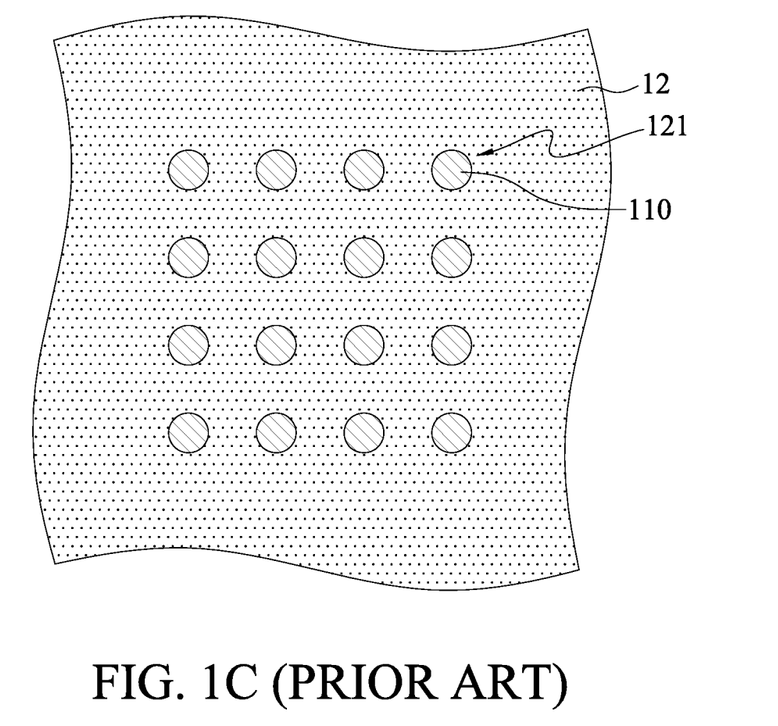
FIG. 1C is a schematic partial top plan view of the package substrate according to another embodiment of the conventional semiconductor package.

Furthermore, the insulating protection layer 12 can also use a plurality of openings 121 that are corresponding to and exposing the electrical contact pads 110 to replace the window 120, as shown in FIG. 1C, so as to reduce an area where the underfill 14 contacts the circuit layer 11. However, when the underfill 14 flows between the semiconductor chip 13 and the package substrate 10, the filler with larger particles in the underfill 14 cannot pass between the semiconductor chip 13 and the package substrate 10 and thus voids are generated, so that the popcorn phenomenon is prone to occur in the subsequent process, resulting in a decrease in product yield.

Therefore, how to overcome the above-mentioned various problems of the prior art has become an urgent problem to be solved at present.

SUMMARY

In view of the various deficiencies of the prior art, the present disclosure provides a substrate structure, comprising: a substrate body having a bonding surface; a circuit layer formed on the bonding surface and having a plurality of electrical contact pads, wherein a first section and a second section are defined on an edge of at least one of the electrical contact pads, and a perimeter of at least one of the electrical contact pads in the first section is greater than or equal to a perimeter of at least one of the electrical contact pads in the second section; and an insulating protection layer formed on the bonding surface and provided with a plurality of openings, wherein the plurality of electrical contact pads are correspondingly exposed from the plurality of openings, wherein the insulating protection layer is formed with at least one active region surrounding at least one of the electrical contact pads at at least one of the openings, and the active region includes a reinforcing portion surrounding the first section and a hollow portion communicating with at least one of the openings and surrounding the second section.

In the aforementioned substrate structure, a shape of the plurality of electrical contact pads is a circle, an ellipse, or a polygon.

In the aforementioned substrate structure, the at least one active region is a plurality of active regions, and the plurality of active regions are arranged side by side or staggered.

In the aforementioned substrate structure, the reinforcing portion is an insulating material of the insulating protection layer.

In the aforementioned substrate structure, a width of the hollow portion is greater than a width of the opening.

In the aforementioned substrate structure, a form of the plurality of openings is of solder-mask defined pad design specification or non-solder mask defined specification.

The present disclosure further provides an electronic package, comprising: the aforementioned substrate structure; and an electronic element disposed on the substrate structure and electrically connected to the circuit layer.

The present disclosure also provides a method of manufacturing an electronic package, comprising: providing the aforementioned substrate structure; and disposing an electronic element on the substrate structure, wherein the electronic element is electrically connected to the circuit layer.

In the aforementioned electronic package and method, the electronic element is disposed on the plurality of electrical contact pads via a plurality of conductive elements, and the plurality of conductive elements are covered with an encapsulation layer.

As can be seen from the above, in the electronic package and the manufacturing method thereof and the substrate structure of the present disclosure, via the design of the active region, the reinforcing portion surrounds the electrical contact pad to cover part of the circuit layer, so as to reduce the exposed area of the circuit layer. Therefore, compared with the prior art, the encapsulation layer can contact less circuit layer and more dielectric materials and insulating protection layer in the die-placement region, so that the bonding force between the encapsulation layer and the substrate structure can be greatly improved, so as to effectively avoid the problem of delamination.

Further, via the design of the active region, the hollow portion surrounds the electrical contact pad to reduce the barrier of the insulating protection layer. Therefore, compared with the prior art, when the encapsulation layer such as underfill flows between the electronic element and the substrate structure, the larger particles in the underfill can smoothly pass through the channel between the electronic element and the substrate structure, so as to avoid the problem of voids in the encapsulation layer. Therefore, the popcorn phenomenon will not occur in the subsequent process, thereby improving the product yield.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "a," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 2A:
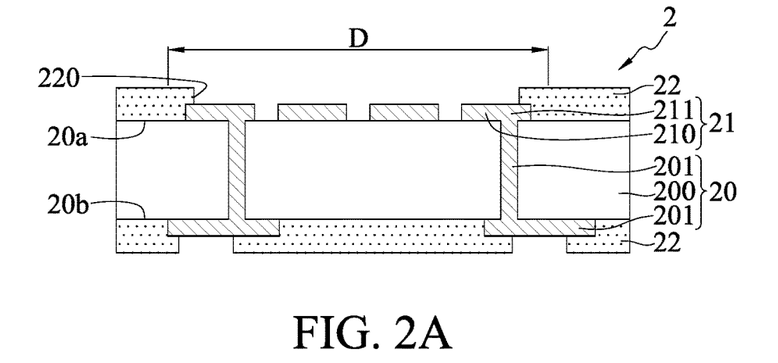
FIG. 2A to FIG. 2B are schematic cross-sectional views illustrating a manufacturing method of an electronic package according to the present disclosure.
Figure 2B:
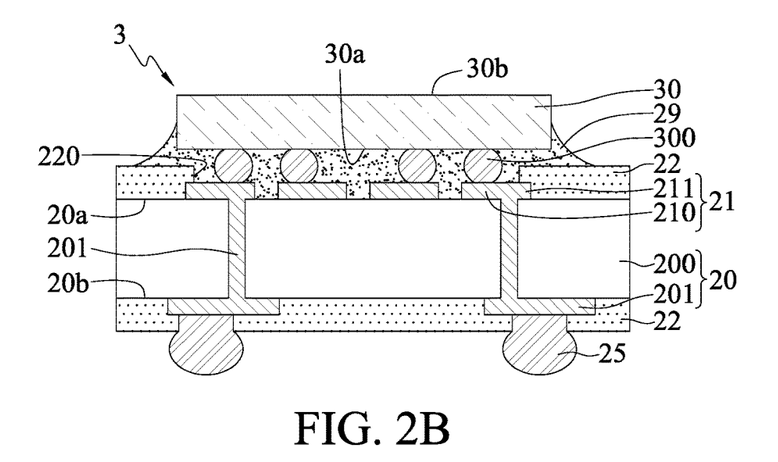
Figure 2C:
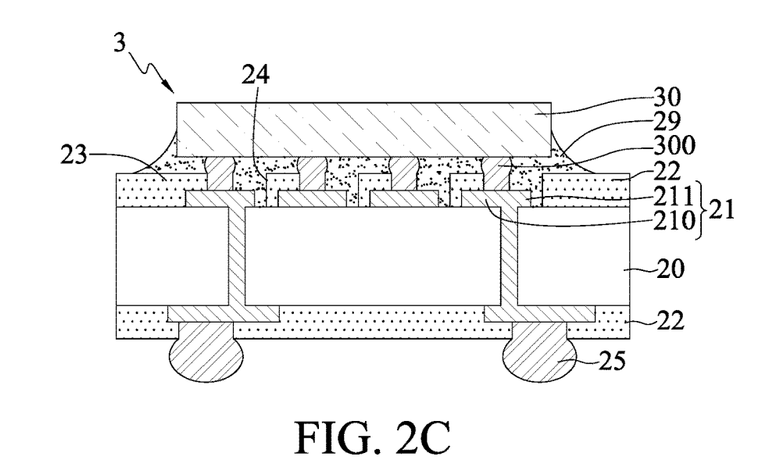
FIG. 2C is a schematic cross-sectional view of another region of FIG. 2B.

FIG. 2A to FIG. 2B are schematic cross-sectional views illustrating a manufacturing method of an electronic package 3 according to the present disclosure.

As shown in FIG. 2A, a substrate structure 2 is provided and includes a substrate body 20, a circuit layer 21 and an insulating protection layer 22.

The substrate body 20 has a bonding surface 20a and a ball-placement surface 20b opposing the bonding surface 20a. The circuit layer 21 and the insulating protection layer 22 are arranged on the bonding surface 20a, and a die-placement region D is defined on the bonding surface 20a, as shown in FIG. 3A.

In an embodiment, the substrate body 20 is a circuit structure with a core layer or a coreless circuit structure, such as a package substrate. The substrate body 20 includes at least one dielectric layer 200 and at least one wiring/routing layer 201 bonded to the dielectric layer 200. For example, the routing layer 201 is formed in the form of a redistribution layer (RDL), and the material for forming the routing layer 201 is copper. The material for forming the dielectric layer 200 is a dielectric material such as polybenzoxazole (PBO), polyimide (PI), prepreg (PP) and the like. It should be understood that the substrate body 20 can also be other carrier units that can be connected to electronic elements, such as wafers, chips, silicon interposers, silicon materials, glass and other semiconductor boards, which are not limited to the above.

The circuit layer 21 is formed on the bonding surface 20a of the substrate body 20 and is electrically connected to the routing layer 201 of the substrate body 20.

Figure 3A:
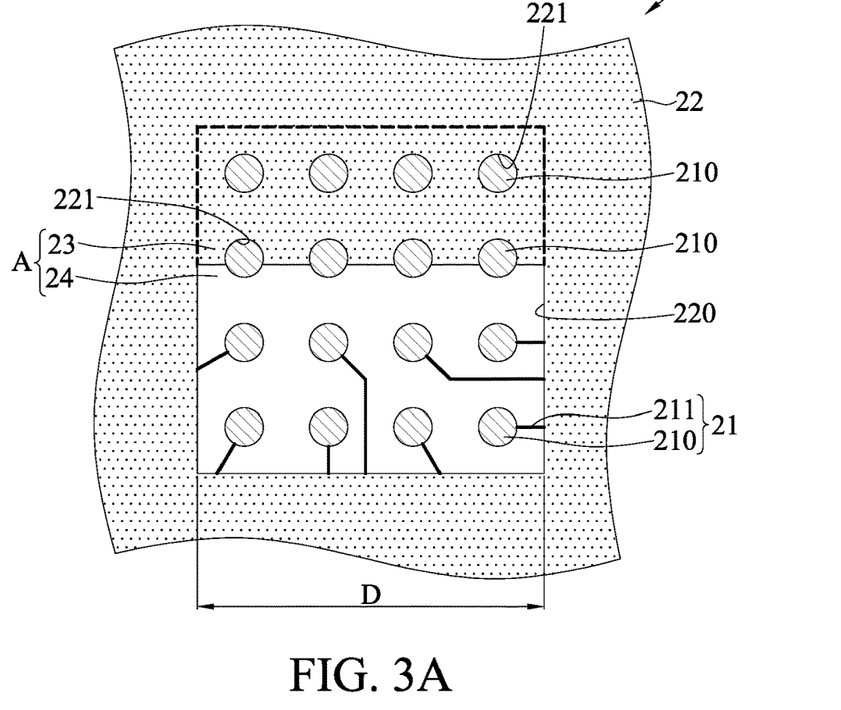
FIG. 3A is a schematic partial top plan view of a substrate structure according to the present disclosure.
Figure 3B:
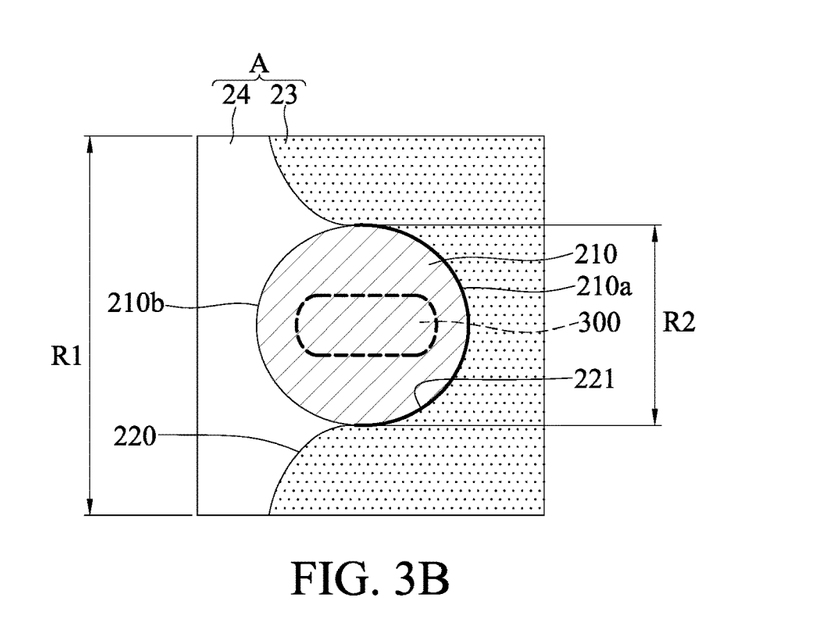
FIG. 3B is a schematic partial enlarged view of FIG. 3A.

Please refer to FIG. 3A and FIG. 3B together. In an embodiment, the circuit layer 21 includes a plurality of conductive traces 211 and a plurality of electrical contact pads 210 integrally bonded with the plurality of conductive traces 211, wherein the conductive traces 211 are separated from each other without shorting (as shown in FIG. 3A), and a first section 210a and a second section 210b are defined at the edge of the electrical contact pad 210 (as shown in FIG. 3B), and wherein the perimeter of the electrical contact pad 210 at the first section 210a is greater than or equal to the perimeter of the electrical contact pad 210 at the second section 210b.

Figure 4A:
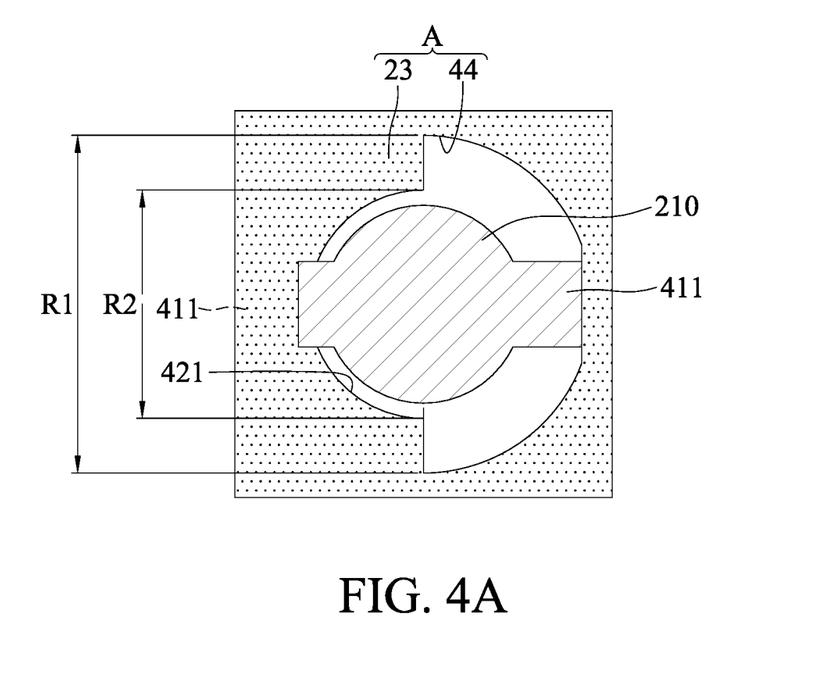
FIG. 4A is a schematic partial top plan view of the substrate structure according to another embodiment of the present disclosure.

Furthermore, the specifications of the circuit layer 21 can be designed by means of bump on lead (BOL) or bump on trace, and the electrical contact pad 210 as shown in FIG. 4A is located on a segment of the conductive trace 411, so that the conductive trace 411 is extended on both sides of the electrical contact pad 210.

The insulating protection layer 22 is formed on the bonding surface 20a of the substrate body 20, and is configured with a plurality of openings 221 and at least one window 220 corresponding to the die-placement region D, as shown in FIG. 3A, so that part of the bonding surface 20a of the substrate body 20, part of the conductive traces 211 and part of the electrical contact pads 210 are exposed from the window 220, and part of the plurality of electrical contact pads 210 are correspondingly exposed from the plurality of openings 221, so that the insulating protection layer 22 only covers part of the circuit layer 21 and part of the bonding surface 20a. In addition, the insulating protection layer 22 is formed with at least one active region A located in the die-placement region D, and the active region A surrounds the electrical contact pads 210 of the die-placement region D, wherein the active region A includes a reinforcing portion 23 surrounding the first section 210a, and a hollow portion 24 communicating with the opening 221 (where the opening 221 exposes the electrical contact pad 210) and surrounding the second section 210b, as shown in FIG. 3A and FIG. 3B, so that the length of the edge of the reinforcing portion 23 corresponding to the electrical contact pad 210 is greater than or equal to the length of the edge of the hollow portion 24 corresponding to the electrical contact pad 210.

In an embodiment, the reinforcing portion 23 is an insulator integrally formed with the insulating protection layer 22, so the reinforcing portion 23 can be regarded as a part of the insulating protection layer 22, and the hollow portion 24 is a hole connecting the reinforcing portion 23, wherein the width R1 of the hollow portion 24 is greater than the width R2 of the opening 221, as shown in FIG. 3B. For example, the electrical contact pad 210 is circular, and the hollow portion 24 is a part of the window 220, so that the opening 221 and the window 220 communicate with each other, such that the edge of the window 220 has a tooth shape or a concave and convex shape. However, the hollow portion 44 may not communicate with the window 220 (e.g., the hollow portion 44 may only communicate with the opening 221), as shown in FIG. 4A or FIG. 4B, and the hollow portion 44 may expose the conductive traces 211.

Figure 3C:
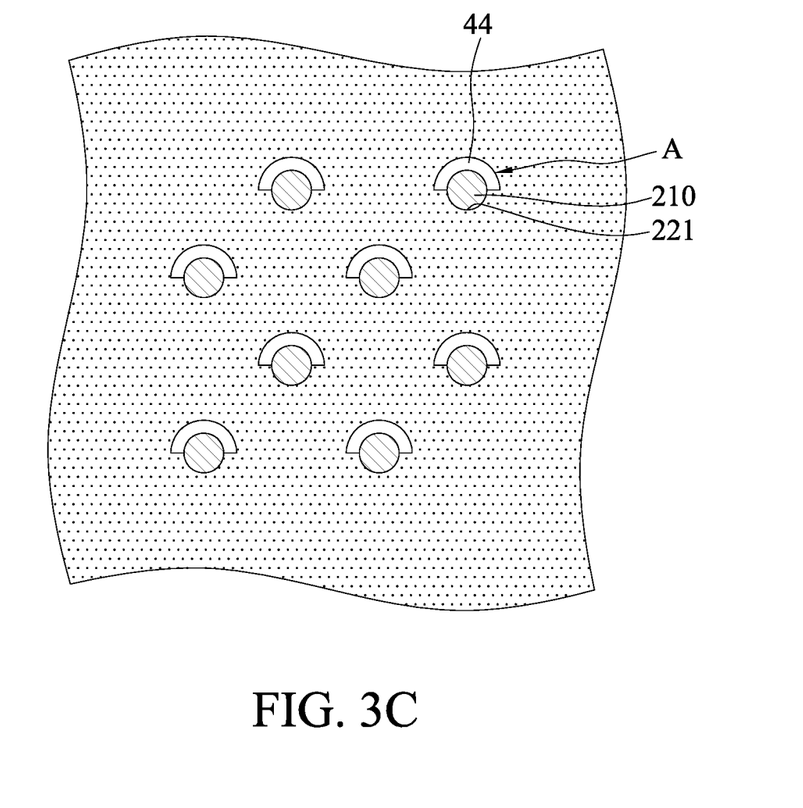
FIG. 3C is a schematic partial top plan view showing another aspect of FIG. 3A.

Furthermore, as shown in FIG. 3A, in an embodiment, the die-placement region D is configured with a plurality of active regions A, and the layout of the action regions A is arranged side by side. Alternatively, the layout of the active regions A is staggered, as shown in FIG. 3C.

Figure 4B:
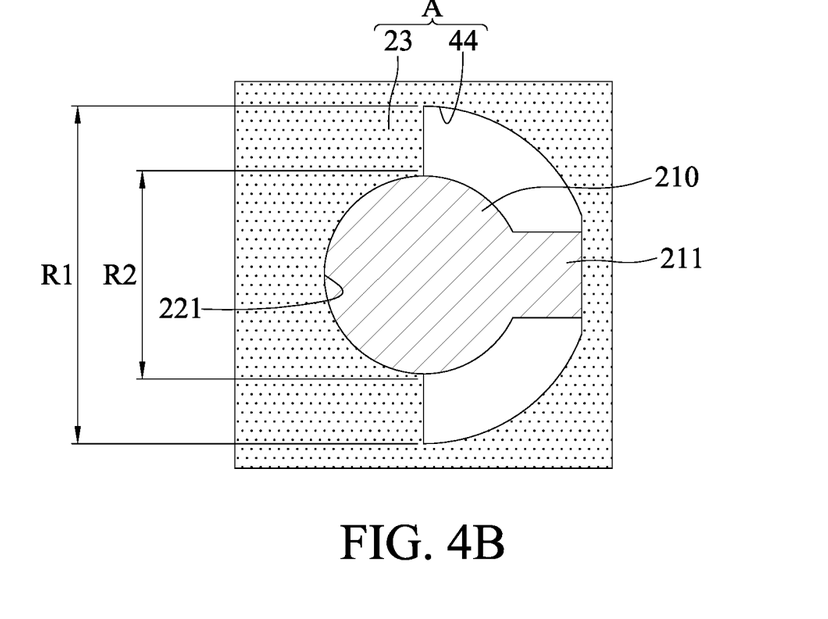
FIG. 4B is a schematic partial top plan view showing another aspect of FIG. 4A.

As shown in FIG. 3A or FIG. 4B, the form of the opening 221 may be of solder-mask defined pad design (SMD) specification/standard; or as shown in FIG. 4A, the form of the opening 421 may be of non-solder mask defined (NSMD) specification/standard, and the widths R1 of the corresponding hollow portions 24 and 44 are both greater than the widths R2 of the two standard openings 221 and 421.

Figure 5:
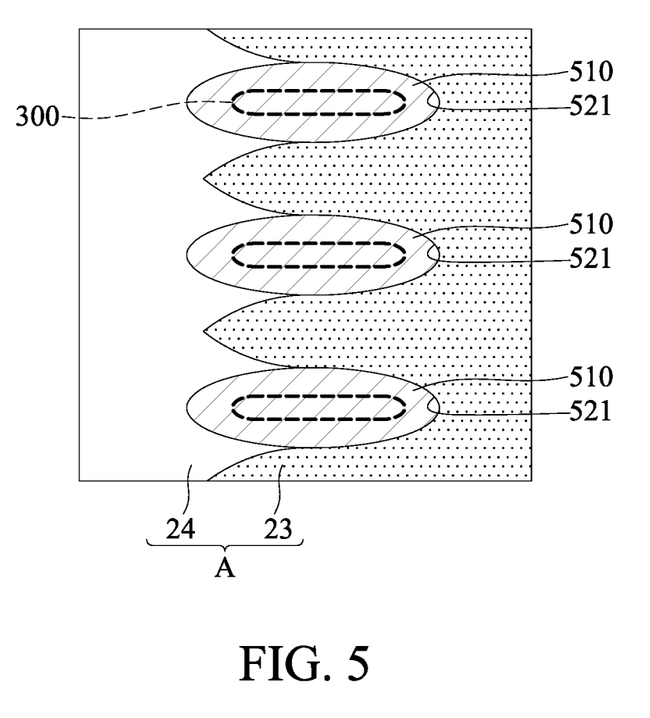
FIG. 5 is a schematic partial top plan view showing another embodiment of FIG. 3B.
Figure 6A:
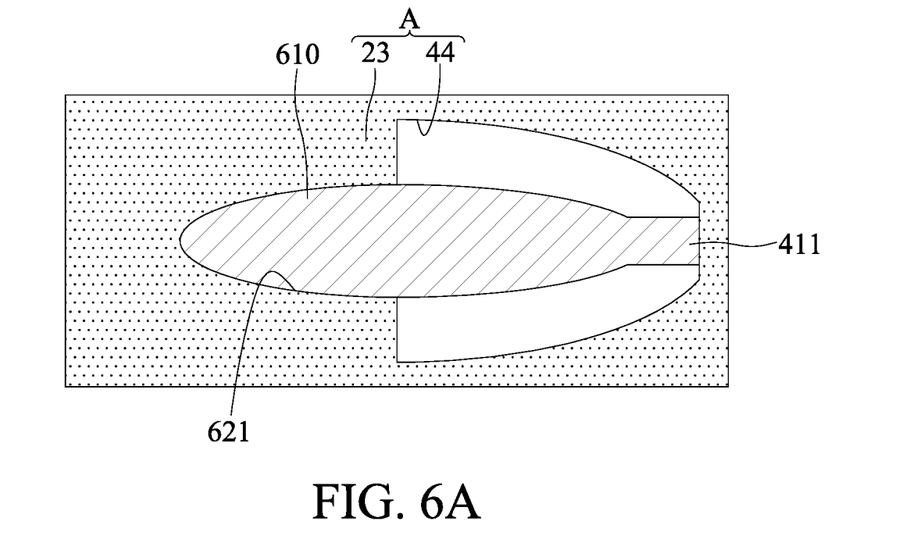
FIG. 6A is a schematic partial top plan view showing another embodiment of FIG. 4A.
Figure 6B:
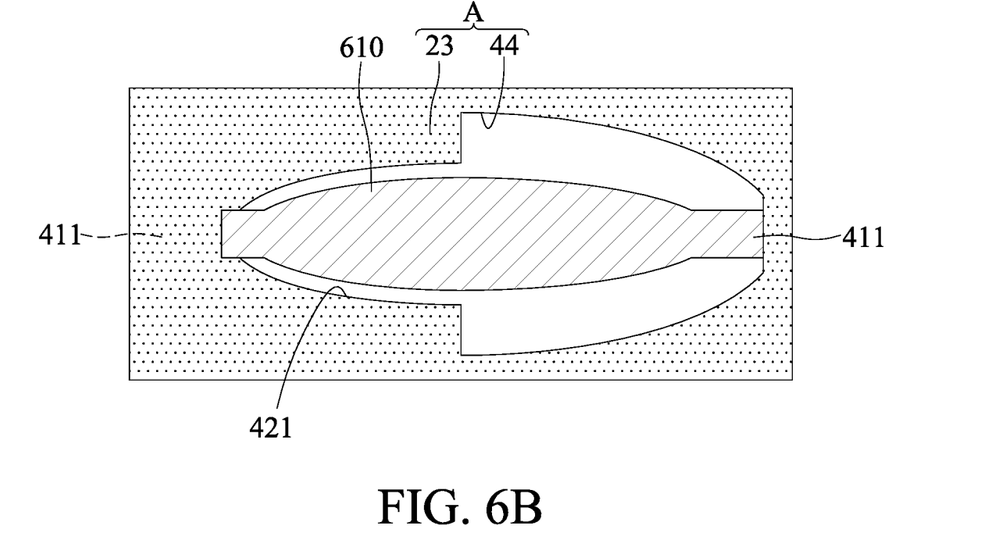
FIG. 6B is a schematic partial top plan view showing another aspect of FIG. 6A.
Figure 7:
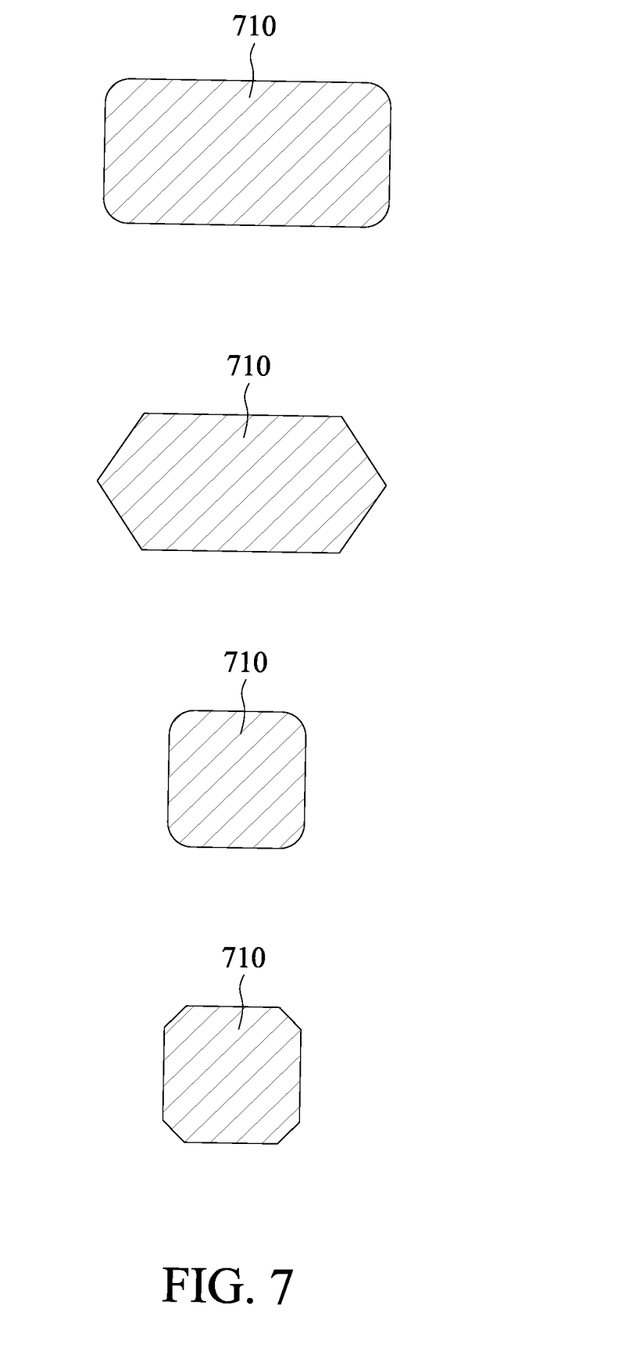
FIG. 7 is a schematic top plan view showing various shapes of the electrical contact pad of the substrate structure according to the present disclosure.

In addition, in other embodiments, the electrical contact pads 510, 610 may be non-circular, such as elliptical or elliptical-like (e.g., elongated) as shown in FIG. 5, FIG. 6A and FIG. 6B, and the openings 421, 521, 621 are also non-circular corresponding to the shape of the electrical contact pads 510, 610. It should be understood that the shape of the electrical contact pad can be designed according to requirements, such as the electrical contact pad 710 of various geometric shapes such as a rectangle or other polygons as shown in FIG. 7, and the present disclosure is not limited to as such.

As shown in FIG. 2B, at least one electronic element 30 is disposed on the electrical contact pads 210 of the substrate structure 2, so that the electronic element 30 is electrically connected to the circuit layer 21, and a plurality of solder balls 25 are formed on the ball-placement surface 20b.

The electronic element 30 can be an active element, a passive element, a package substrate, or a package module, etc., wherein the active element is, for example, a semiconductor chip, and the passive element is, for example, a resistor, a capacitor, or an inductor. In an embodiment, the electronic element 30 has an active surface 30a and an inactive surface 30b opposing the active surface 30a, and the active surface 30a has a plurality of electrode pads (not shown) and is bonded to and electrically connected to the electrical contact pads 210 via a plurality of conductive elements 300, wherein the conductive elements 300 are, for example, blocks containing solder material or metal blocks (e.g., copper pillars).

Furthermore, in the subsequent process, an encapsulation layer 29 can be formed on the bonding surface 20a of the substrate structure 2 to cover the conductive elements 300, and even cover the electronic element 30. For example, the encapsulation layer 29 can be an insulating material such as underfill, polyimide (PI), dry film, encapsulation colloid such as epoxy resin, or molding compound, etc., and the present disclosure is not limited to as such.

Therefore, in the manufacturing method of the electronic package 3 of the present disclosure, a portion of the electrical contact pad 210, 510, 610, 710 is surrounded by the reinforcing portion 23 mainly via the design of the active region A, so as to cover part of the conductive traces 211, 411 to reduce the exposed area of the conductive traces 211, 411. Therefore, compared with the prior art, the encapsulation layer 29 in the die-placement region D can contact less circuit layer 21 and more dielectric materials (i.e., the dielectric layer 200 of the substrate structure 2) and insulating protection layer 22. Therefore, the bonding force between the encapsulation layer 29 and the substrate structure 2 is greatly improved, so as to effectively avoid the problem of delamination between the encapsulation layer 29 and the substrate structure 2.

Furthermore, via the design of the active region A, a portion of the electrical contact pad 210, 510, 610, 710 is surrounded by the hollow portion 24, 44, so as to reduce the barrier of the insulating protection layer 22. Therefore, compared with the prior art, when the encapsulation layer 29 (e.g., underfill) flows between the electronic element 30 and the substrate structure 2, larger particles in the encapsulation layer 29 can smoothly pass through the channel between the electronic element 30 and the substrate structure 2, so as to avoid the problem of voids in the encapsulation layer 29. Therefore, the popcorn phenomenon will not occur in the subsequent process, thereby improving the product yield.

The present disclosure further provides an electronic package 3 including a substrate structure 2 and at least one electronic element 3. The substrate structure 2 includes a substrate body 20, a circuit layer 21 and an insulating protection layer 22.

The substrate body 20 has a bonding surface 20a.

The circuit layer 21 is formed on the bonding surface 20a and has a plurality of electrical contact pads 210, 510, 610, 710, wherein the edge of each of the electrical contact pads 210, 510, 610, 710 is defined with a first section 210a and a second section 210b, so that the perimeter of each of the electrical contact pads 210, 510, 610, 710 in the first section 210a is greater than or equal to the perimeter of each of the electrical contact pads 210, 510, 610, 710 in the second section 210b.

The insulating protection layer 22 is formed on the bonding surface 20a and is provided with a plurality of openings 221, 421, so that the plurality of electrical contact pads 210, 510, 610, 710 are correspondingly exposed from the plurality of openings 221, 421, wherein the insulating protection layer 22 is formed with at least one active region A surrounding the electrical contact pads 210, 510, 610, 710 at at least one of the openings 221, 421, 521, 621, and the active region A includes a reinforcing portion 23 surrounding the first section 210a and a hollow portion 24, 44 communicating with the openings 221, 421, 521, 621 and surrounding the second section 210b.

The electronic element 30 is disposed on the bonding surface 20a of the substrate structure 2 to electrically connect the circuit layer 21.

In one embodiment, the shape of the electrical contact pads 210, 510, 610, 710 is a circle, an ellipse, or a polygon.

In one embodiment, the at least one active region A is a plurality of active regions A, and the plurality of active regions A are arranged side by side or staggered.

In one embodiment, the reinforcing portion 23 is an insulating material of the insulating protection layer 22.

In one embodiment, the width R1 of the hollow portions 24, 44 is greater than the width R2 of the openings 221, 421.

In one embodiment, the openings 221, 421, 521, 621 are in the form of solder-mask defined pad design specification or non-solder mask defined specification.

In one embodiment, the electronic element 30 is disposed on the plurality of electrical contact pads 210, 510, 610, 710 via a plurality of conductive elements 300, and the plurality of conductive elements 300 are covered with the encapsulation layer 29.

To sum up, in the electronic package and the manufacturing method thereof and the substrate structure of the present disclosure, via the design of the active region, the reinforcing portion covers the conductive traces around the electrical contact pads to reduce the exposed area of the circuit layer. Therefore, the encapsulation layer can contact less circuit layer and more dielectric materials and insulating protection layer in the die-placement region, so that the bonding force between the encapsulation layer and the substrate structure can be greatly improved, so as to effectively avoid the problem of delamination.

Furthermore, via the design of the active region, the hollow portion reduces regions around the electrical contact pad blocked by the insulating protection layer. Therefore, when the encapsulation layer flows between the electronic element and the substrate structure, the larger particles in the encapsulation layer can smoothly pass through the channel between the electronic element and the substrate structure, so as to avoid the problem of voids in the encapsulation layer. Therefore, the popcorn phenomenon will not occur in the subsequent process, thereby improving the product yield.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. A substrate structure, comprising: a substrate body having a bonding surface; a circuit layer formed on the bonding surface and having a plurality of electrical contact pads, wherein a first section and a second section are defined on an edge of at least one of the electrical contact pads, and a perimeter of at least one of the electrical contact pads in the first section is greater than or equal to a perimeter of at least one of the electrical contact pads in the second section; and an insulating protection layer formed on the bonding surface and provided with a plurality of openings, wherein the plurality of electrical contact pads are correspondingly exposed from the plurality of openings, wherein the insulating protection layer is formed with at least one active region surrounding at least one of the electrical contact pads at at least one of the openings, and the active region includes a reinforcing portion surrounding the first section and a hollow portion communicating with at least one of the openings and surrounding the second section, wherein the at least one active region is a plurality of active regions, and the plurality of active regions are arranged side by side or staggered, wherein a width of the hollow portion is greater than a width of the opening.

2. The substrate structure of claim 1, wherein a shape of the plurality of electrical contact pads is a circle, an ellipse, or a polygon.

3. The substrate structure of claim 1, wherein the reinforcing portion is an insulating material of the insulating protection layer.

4. The substrate structure of claim 1, wherein a form of the plurality of openings is of solder-mask defined pad design specification or non-solder mask defined specification.

5. An electronic package, comprising: the substrate structure of claim 1; and an electronic element disposed on the substrate structure and electrically connected to the circuit layer.

6. The electronic package of claim 5, wherein the electronic element is disposed on the plurality of electrical contact pads via a plurality of conductive elements, and the plurality of conductive elements are covered with an encapsulation layer.

7. A method of manufacturing an electronic package, comprising: providing the substrate structure of claim 1; and disposing an electronic element on the substrate structure, wherein the electronic element is electrically connected to the circuit layer.

8. The method of claim 7, wherein the electronic element is disposed on the plurality of electrical contact pads via a plurality of conductive elements, and the plurality of conductive elements are covered with an encapsulation layer.

* * * * *